(12) United States Patent
Hashimoto et al.

(10) Patent No.: US 11,799,442 B2
(45) Date of Patent: Oct. 24, 2023

(54) MANUFACTURING METHOD OF MOUNTING STRUCTURE, AND LAMINATE SHEET THEREFOR

(71) Applicant: NAGASE CHEMTEX CORPORATION, Osaka (JP)

(72) Inventors: Takayuki Hashimoto, Tatsuno (JP); Takuya Ishibashi, Tatsuno (JP); Kazuki Nishimura, Tatsuno (JP)

(73) Assignee: NAGASE CHEMTEX CORPORATION, Osaka (JP)

( * ) Notice: Subject to any disclaimer, the term of this patent is extended or adjusted under 35 U.S.C. 154(b) by 570 days.

(21) Appl. No.: 16/650,709

(22) PCT Filed: Sep. 28, 2018

(86) PCT No.: PCT/JP2018/036282
§ 371 (c)(1),
(2) Date: Mar. 25, 2020

(87) PCT Pub. No.: WO2019/065976
PCT Pub. Date: Apr. 4, 2019

(65) Prior Publication Data
US 2020/0287518 A1   Sep. 10, 2020

(30) Foreign Application Priority Data
Sep. 29, 2017   (JP) ................. 2017-191944

(51) Int. Cl.
*H01L 23/373* (2006.01)
*H03H 9/08* (2006.01)
(Continued)

(52) U.S. Cl.
CPC ............... *H03H 9/08* (2013.01); *H03H 3/08* (2013.01); *H03H 9/059* (2013.01);
(Continued)

(58) Field of Classification Search
CPC ............ H03H 9/08; H03H 3/08; H03H 9/059; H03H 9/1078; H01L 41/0475;
(Continued)

(56) References Cited

U.S. PATENT DOCUMENTS 7,228,894 B2 * 6/2007 Moore ................... H01L 23/36
257/E23.101
7,552,532 B2 * 6/2009 Stelzl ..................... H01L 23/10
29/841

(Continued)

FOREIGN PATENT DOCUMENTS

CN        105210184 A    12/2015
JP        2001-160607 A   6/2001
(Continued)

OTHER PUBLICATIONS

Office Action dated Jun. 18, 2021 from the Taiwanese Patent Office in Taiwanese Application No. 107134552.
(Continued)

*Primary Examiner* — Eduardo A Rodela
(74) *Attorney, Agent, or Firm* — Sughrue Mion, PLLC

(57) ABSTRACT

A manufacturing method of a mounting structure, the method including: a step of preparing a mounting member including a first circuit member and a plurality of second circuit members placed on the first circuit member, the mounting member having a space between the first circuit member and the second circuit member; a step of preparing a laminate sheet including a first thermal-conductive layer and a second thermal-conductive layer, the first thermal-conductive layer disposed at least on one outermost side; a disposing step of disposing the laminate sheet on the mounting member such that the first thermal-conductive layer faces the second circuit members; and a sealing step of pressing the laminate sheet against the first circuit member and heating the laminate sheet, to seal the second circuit (Continued)

members so as to maintain the space, and to cure the laminate sheet. The first thermal-conductive layer after curing has a coefficient of thermal conductivity in a thickness direction at room temperature being equal to or greater than that in a principal surface direction, and the second thermal-conductive layer after curing has a coefficient of thermal conductivity in a principal surface direction at room temperature being greater than that in a thickness direction.

11 Claims, 4 Drawing Sheets

(51) Int. Cl.
　　*H03H 3/08*　　　　(2006.01)
　　*H03H 9/05*　　　　(2006.01)
　　*H03H 9/10*　　　　(2006.01)
　　*H10N 30/02*　　　(2023.01)
　　*H10N 30/88*　　　(2023.01)
　　*H10N 30/088*　　(2023.01)
　　*H10N 30/87*　　　(2023.01)

(52) U.S. Cl.
　　CPC .......... *H03H 9/1078* (2013.01); *H10N 30/02* (2023.02); *H10N 30/088* (2023.02); *H10N 30/875* (2023.02); *H10N 30/88* (2023.02)

(58) Field of Classification Search
　　CPC ..... H01L 41/053; H01L 41/23; H01L 41/338; H01L 23/28; H01L 23/29; H01L 23/293; H01L 23/295; H01L 23/31; H01L 23/3121; H01L 23/3135; H01L 23/3737; H01L 21/56; H01L 21/563; H01L 2021/60022
　　See application file for complete search history.

(56) References Cited

U.S. PATENT DOCUMENTS

| | | | |
|---|---|---|---|
| 7,687,895 B2* | 3/2010 | Brunnbauer | H01L 21/568 257/723 |
| 8,156,644 B2* | 4/2012 | Babb | H05K 3/284 29/841 |
| 9,165,849 B2* | 10/2015 | Hatanaka | H03H 9/1085 |
| 9,293,423 B2* | 3/2016 | Brunnbauer | H01L 21/561 |
| 9,414,530 B1* | 8/2016 | Howard | H01L 23/36 |
| 9,647,189 B2* | 5/2017 | Tischler | H01L 24/75 |
| 2004/0213973 A1* | 10/2004 | Hara | C09J 123/0869 156/298 |
| 2011/0133236 A1 | 6/2011 | Nozaki et al. | |
| 2012/0055015 A1* | 3/2012 | Toyoda | H01L 23/3121 29/829 |
| 2016/0133579 A1* | 5/2016 | Akiba | H01L 24/94 257/659 |
| 2017/0330813 A1* | 11/2017 | Nakamura | H01L 23/3114 |
| 2018/0062611 A1* | 3/2018 | Ha | H05K 3/28 |
| 2020/0006309 A1* | 1/2020 | Chen | H01L 21/481 |

FOREIGN PATENT DOCUMENTS

| | | | | |
|---|---|---|---|---|
| JP | 2008-098419 A | | 4/2008 | |
| JP | 2010-34254 A | | 2/2010 | |
| JP | 2013-118260 A | | 6/2013 | |
| JP | 2013118260 A | * | 6/2013 | ............ H01L 21/34 |
| JP | 2015-035567 A | | 2/2015 | |
| JP | 2016-000784 A | | 1/2016 | |
| JP | 2016-32008 A | | 3/2016 | |
| JP | 2016-174123 A | | 9/2016 | |
| JP | 2017-092103 A | | 5/2017 | |
| JP | 2017-108183 A | | 6/2017 | |
| WO | 2008/087373 A2 | | 7/2008 | |
| WO | 2015/019846 A1 | | 2/2015 | |
| WO | 2015/190389 A | | 12/2015 | |
| WO | 2016/098697 A1 | | 6/2016 | |

OTHER PUBLICATIONS

International Search Report for PCT/JP2018/036282 dated Nov. 27, 2018 [PCT/ISA/210].

Written Opinion for PCT/JP2018/036282 dated Nov. 27, 2018 [PCT/ISA/237].

Extended European Search Report dated Jan. 15, 2021 by the European Patent Office in European application No. 18861304.6.

Office Action dated Mar. 1, 2023 in Chinese Application No. 201880060735.X.

* cited by examiner

MANUFACTURING METHOD OF MOUNTING STRUCTURE, AND LAMINATE SHEET THEREFOR

CROSS REFERENCE TO RELATED APPLICATIONS

This application is a National Stage of International Application No. PCT/JP2018/036282 filed Sep. 28, 2018, claiming priority based on Japanese Patent Application No. 2017-191944 filed Sep. 29, 2017.

TECHNICAL FIELD

The present invention relates to a manufacturing method of a mounting structure having a space inside, specifically to a manufacturing method of a mounting structure sealed with a laminate sheet, and a laminate sheet therefor.

BACKGROUND ART

Some electronic components (circuit members) placed on a circuit board needs a space from the circuit board. One example is a SAW chip used for noise cancellation in cellular phones and other devices. The SAW chip filters a desired frequency by utilizing a surface acoustic wave that propagates on a piezoelectric substrate (piezoelectric body). Therefore, a space is necessary between the electrodes on the piezoelectric body and the circuit board on which the SAW chip is placed.

The SAW chip generates heat by itself when power is turned on. When the temperature of the SAW chip rises due to the self-heating, frequency fluctuations occur, which may lower the reception sensitivity. Furthermore, the deterioration of the SAW chip itself may make its long-term use difficult. One proposal suggests blending a thermally conductive material in a resin sheet for sealing the SAW chip, thereby to facilitate heat dissipation (Patent Literatures 1 and 2).

CITATION LIST

Patent Literature

[PTL 1] Japanese Laid-Open Patent Publication No. 2015-35567
[PTL 2] Japanese Laid-Open Patent Publication No. 2016-784

SUMMARY OF INVENTION

Technical Problem

Merely by blending a thermally conductive material in a sealing resin sheet as disclosed in Patent Literatures 1 and 2, however, it is difficult to allow the heat generated inside the SAW chip to dissipate quickly via the resin sheet to the substrate. With advancing integration and densification of the electronic components on which the SAW chip is placed, heat dissipation of the SAW chip has been increasingly seen as important.

Solution to Problem

In view of the above, one aspect of the present invention relates to a manufacturing method of a mounting structure, the method including: a step of preparing a mounting member including a first circuit member and a plurality of second circuit members placed on the first circuit member, the mounting member having a space between the first circuit member and the second circuit member; a step of preparing a laminate sheet including a first thermal-conductive layer and a second thermal-conductive layer, the first thermal-conductive layer disposed at least on one outermost side; a disposing step of disposing the laminate sheet on the mounting member such that the first thermal-conductive layer faces the second circuit members; and a sealing step of pressing the laminate sheet against the first circuit member and heating the laminate sheet, to seal the second circuit members so as to maintain the space, and to cure the laminate sheet, wherein the first thermal-conductive layer after curing has a coefficient of thermal conductivity in a thickness direction at room temperature being equal to or greater than a coefficient of thermal conductivity in a principal surface direction, and the second thermal-conductive layer after curing has a coefficient of thermal conductivity in a principal surface direction at room temperature being greater than a coefficient of thermal conductivity in a thickness direction.

Another aspect of the present invention relates to a laminate sheet for sealing a mounting member including a first circuit member and a plurality of second circuit members placed on the first circuit member, the mounting member having a space between the first circuit member and the second circuit member, the laminate sheet including: a first thermal-conductive layer and a second thermal-conductive layer, the first thermal-conductive layer disposed at least on one outermost side, wherein the first thermal-conductive layer after curing has a coefficient of thermal conductivity in a thickness direction at room temperature being equal to or greater than a coefficient of thermal conductivity in a principal surface direction, and the second thermal-conductive layer after curing has a coefficient of thermal conductivity in a principal surface direction at room temperature being greater than a coefficient of thermal conductivity in a thickness direction.

Advantageous Effects of Invention

According to the present invention, the mounting structure can be hollow-sealed, and the heat dissipation performance of the mounting structure can be improved.

BRIEF DESCRIPTION OF DRAWINGS

FIG. 3(a) shows a state before the laminate sheet is cured, and FIG. 3(b) shows a state after the laminate sheet is cured FIG. 4(a)-FIG. 4(d) A set of schematic diagrams for explaining a manufacturing method according to an embodiment of the present invention by way of cross sections of the mounting member or the mounting structure.

DESCRIPTION OF EMBODIMENTS

Figure 1:
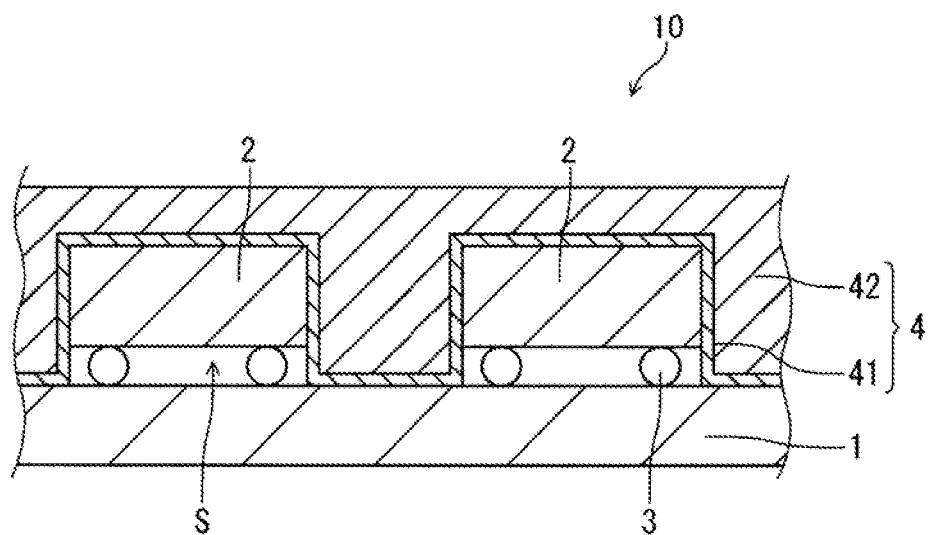
FIG. 1 A schematic cross-sectional view of a mounting structure according to an embodiment of the present invention.

An example of a mounting structure manufactured by a method according to the present embodiment is shown in FIG. 1. FIG. 1 is a schematic cross-sectional view of a mounting structure 10.

The mounting structure 10 includes a first circuit member 1, a plurality of second circuit members 2 placed on the first circuit member 1, and a sealing material 4 sealing the second circuit members 2. A space (internal space S) is formed between the first circuit member 1 and the second circuit member 2. The sealing material 4 is provided for sealing the second circuit members 2 so as to maintain the internal space S, and for releasing the heat generated from the second circuit members 2. Although the second circuit members 2 are placed on the first circuit member 1 with bumps 3 interposed therebetween in the present embodiment, the placing way on the first circuit member 1 is not limited thereto.

Figure 2:
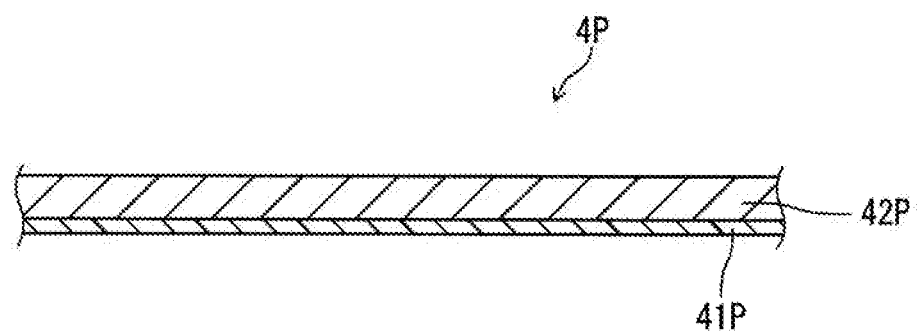
FIG. 2 A schematic cross-sectional view of a laminate sheet according to an embodiment of the present invention.

The sealing material 4 is a cured product of a laminate sheet 4P. The present invention encompasses the laminate sheet 4P. The laminate sheet 4P includes a first thermal-conductive layer 41P disposed at least on one outermost side and a second thermal-conductive layer 42P, as illustrated in FIG. 2. Thus, the obtained sealing material 4 has a laminated structure including at least a cured product layer of the first thermal-conductive layer 41P (hereinafter, a first cured thermal-conductive layer 41), and a cured product layer of the second thermal-conductive layer 42P (hereinafter, a second cured thermal-conductive layer 42). The laminate sheet 4P is an uncured or semi-cured product, and the first and second thermal-conductive layers 41P and 42P are each also an uncured or semi-cured product. FIG. 2 is a schematic cross-sectional view of the laminate sheet 4P.

In the first cured thermal-conductive layer 41, a coefficient of thermal conductivity $\lambda 1_T$ in the thickness direction at room temperature (20 to 30° C.) is equal to or greater than a coefficient of thermal conductivity $\lambda 1_S$ in the principal surface direction. On the other hand, in the second cured thermal-conductive layer 42, a coefficient of thermal conductivity $\lambda 2_S$ in the principal surface direction at room temperature is greater than a coefficient of thermal conductivity $\lambda 2_T$ in the thickness direction. To the second circuit members 2, which are heat sources, one principal surface (first inner surface) of the first cured thermal-conductive layer 41 is faced. The heat generated from the second circuit members 2 is, therefore, quickly transmitted from the inner surface of the first cured thermal-conductive layer 41 to its inside, and quickly transmitted from the inside to the other principal surface (first outer surface). The heat transmitted to the first outer surface is transmitted to one principal surface (second inner surface) of the second cured thermal-conductive layer 42 contacting the first outer surface. The heat transmitted to the second inner surface moves inside the second cured thermal-conductive layer 42 mostly in the principal surface direction. The heat having reached the portion where the first cured thermal-conductive layer 41 is in contact with the first circuit member 1 is transmitted again to the first cured thermal-conductive layer 41, and then dissipates to the first circuit member 1.

[Laminate Sheet]

In the sealing step, the laminate sheet 4P disposed such that the first thermal-conductive layer 41P faces the second circuit members 2 is pressed against the first circuit member 1. Thus, part of the laminate sheet 4P is brought into close contact with the surfaces of the second circuit members 2, and other part of it reaches the surfaces of the first circuit member 1 between the second circuit members 2. At this time, at least one of the first thermal-conductive layer 41P and the second thermal-conductive layer 42P has an elasticity that allows it to come in close contact with and seal the surfaces of the second circuit members 2 and the surfaces between the second circuit members 2 of the first circuit member 1, so as to maintain the internal space S. Here, in view of further improving the heat dissipation performance, the laminate sheet 4, when the second circuit members 2 are sealed, preferably includes: a first thermal-conductive layer 41P having an elasticity that allows it to come in close contact with and seal the surfaces of the second circuit members and the surfaces between the second circuit members 2 of the first circuit member 1, so as to maintain the internal space S; and a second thermal-conductive layer 42P having a viscosity that allows it to flow.

Figure 3A:
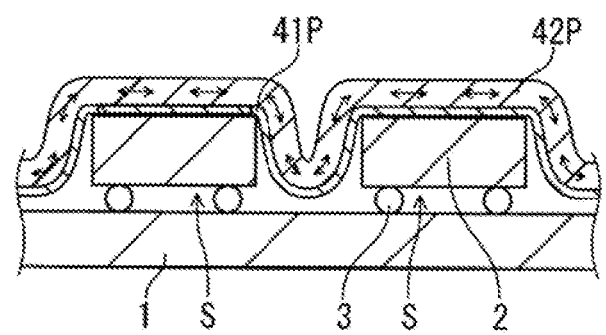
FIG. 3(a)-FIG. 3(b) Schematic cross-sectional views of a mounting member in a sealing step, where
Figure 3B:
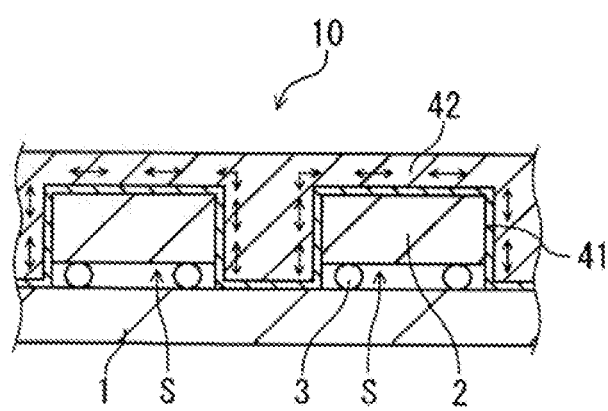

A description will be given, with reference to the drawings, as to why the heat dissipation performance can be further improved when the first thermal-conductive layer 41P and the second thermal-conductive layer 42P have the elasticity and the viscosity as above, respectively, in the sealing step. FIGS. 3(a) and (b) are schematic cross-sectional views of the mounting member during the sealing step. FIG. 3(a) shows a state before the laminate sheet 4P is cured; FIG. 3(b) shows a state after the laminate sheet 4P is cured. In FIG. 3(a)-FIG. 3(b), for ease of understanding, a direction in which the coefficient of thermal conductivity of the second thermal-conductive layer 42P is greater is indicated by an arrow.

In the sealing step, the laminate sheet 4P is pressed against the first circuit member 1. At this time, the first thermal-conductive layer 41P having elasticity is deformed along the outer profile of the second circuit members 2. For example, when entering between the second circuit members 2, the first thermal-conductive layer 41P is curved into a U-shape like falling into between the second circuit members 2. At this time, the second thermal-conductive layer 42P flows in a U-shape, following the curve of the first thermal-conductive layer 41P (FIG. 3(a)). Therefore, for example, when the second thermal-conductive layer 42P contains a thermally conductive filler in a fibrous or flaky form, the thermally conductive filler orients in a similar direction to the flowing direction of the second thermal-conductive layer 42P. In short, the second thermal-conductive layer 42P can cover the second circuit members 2 along the outer profile, while maintaining its high coefficient of thermal conductivity in the principal surface direction. Therefore, even after the laminate sheet 4P is cured, the second cured thermal-conductive layer 42 covering the sides of the second circuit members 2 can conduct heat in the direction toward the first circuit member 1 (FIG. 3(b)). Furthermore, since the thermal conductivity coefficient of the first cured thermal-conductive layer 41 in the thickness direction is equal to or greater than that in the principal surface direction, the heat generated from the second circuit members 2 tends to conduct from the first cured thermal-conductive layer 41 to the second cured thermal-conductive layer 42. Thereafter, the heat conducts again from the second cured thermal-conductive layer 42 to the first cured thermal-conductive layer 41, and dissipates quickly from the first cured thermal-conductive layer 41 to the first circuit member 1.

Furthermore, when the laminate sheet 4P is pressed against the first circuit member 1 in the sealing step, the second thermal-conductive layer 42P having viscosity is deformed, and this further increases the adhesion between the second thermal-conductive layer 42P and the first thermal-conductive layer 41P having elasticity. At this time, to a thermally conductive filler blended in the first thermal-conductive layer 41P (hereinafter, a first thermal-conductive filler), a thermally conductive filler blended in the second thermal-conductive layer 42P (hereinafter, a second thermal-conductive filler) comes easily in contact, improving the thermal conductivity between the first cured thermal-conductive layer 41 and the second cured thermal-conductive layer 42.

As described above, it is possible to improve the thermal conductivity between the first cured thermal-conductive layer 41 and the second cured thermal-conductive layer 42, as well as to allow the heat generated from the second circuit members 2 to dissipate quickly to the first circuit member 1 via the second cured thermal-conductive layer 42 and the first cured thermal-conductive layer 41, and this leads to excellent heat dissipation performance of the mounting structure 10.

A detailed description will be given below of each layer. The present invention, however, is not limited thereto.

(First Thermal-Conductive Layer)

The first thermal-conductive layer 41P is provided for maintaining the internal space S and for releasing the heat of the second circuit members 2. The first thermal-conductive layer 41P, when the second circuit members are sealed, preferably has an of elasticity that allows it to come in close contact with and seal the surfaces of the second circuit members 2 and the surfaces between the second circuit members 2 of the first circuit member 1, so as to maintain the internal space S.

The coefficient of thermal conductivity $\lambda 1_T$ in the thickness direction at room temperature of the first cured thermal-conductive layer 41 is equal to or greater than the coefficient of thermal conductivity $\lambda 1_S$ in the principal surface direction. This facilitates the conduction of the heat of the second circuit members 2 to the first cured thermal-conductive layer 41. A ratio: $\lambda 1_T/\lambda 1_S$ of the coefficient of thermal conductivity $\lambda 1_T$ to the coefficient of thermal conductivity $\lambda 1_S$ may be any value equal to or greater than 1, but may be equal to or greater than 1.2, and may be equal to or greater than 1.5. The coefficient of thermal conductivity $\lambda 1_T$ is not limited, but may be 1 W/m·K or more, and may be 3 W/m·K or more. The coefficient of thermal conductivity is measured according to JIS A 1412-2.

The first thermal-conductive layer is formed of a first resin composition containing a thermosetting resin.

A loss tangent tan δ1 of the first resin composition at a temperature t when the second circuit members 2 are sealed may be 1 or less, may be 0.9 or less, and may be 0.7 or less. The lower limit of the loss tangent tan δ1 is not limited, but is, for example, 0.1. The first thermal-conductive layer 41P having the loss tangent tan δ1 as above can be used alone to seal the second circuit members 2 so as to maintain the internal space S. Therefore, even when the laminate sheet 4P has the second thermal-conductive layer 42P whose viscosity is high, the internal space S can be maintained.

The temperature t when the second circuit members 2 are sealed is a temperature of the laminate sheet 4P when the surfaces of the second circuit members 2 are covered with the laminate sheet 4P, with the internal space S maintained. The temperature of the laminate sheet 4P can be replaced with a setting temperature of a heating means for the laminate sheet 4P in the sealing step. When the heating means for the laminate sheet 4P is a press machine, the setting temperature of the heating means is a setting temperature of the press machine. When the heating means for the laminate sheet 4P is a heater for heating the first circuit member 1, the setting temperature of the heating means is a setting temperature of the heater for the first circuit member 1. The temperature t can be changed according to, for example, the material of the laminate sheet 4P, but may be, for example, between room temperature+15° C. (40° C.) and 200° C. Specifically, the temperature t is, for example, 50° C. or higher and 180° C. or lower. When the second circuit members 2 are sealed, the laminate sheet 4P may be in an uncured state or in a semi-cured state.

The loss tangent tan δ1 is a ratio: G1"/G1' of a loss shear modulus (G1") to a storage shear modulus (G1') of the first resin composition at the temperature t. The storage shear modulus G1' and the loss shear modulus G1" can be measured with a rheometer complying with JIS K 7244. Specifically, the storage shear modulus G1' and the loss shear modulus G1" can be measured on a test piece of 8 mm in diameter×1 mm, using a rheometer (e.g., ARES-LS2, available from TA instruments, Inc.) at a frequency of 1 Hz and a temperature rise rate of 10° C./min. This applies to a loss tangent tan δ2 of the second resin composition forming the second thermal-conductive layer 42P.

The storage shear modulus G1' at the temperature t may be $1.0\times10^7$ Pa or less, and may be $1.0\times10^6$ Pa or less. The lower limit of the storage shear modulus G1' is not limited, but may be, for example, $1.0\times10^4$ Pa. When the storage shear modulus G1' at the temperature t is within the range as above, the first thermal-conductive layer 41P is unlikely to enter the internal space S in the sealing step and is likely to flow so as to come in close contact with the surfaces of the second circuit members 2 and the surfaces between the second circuit members 2 of the first circuit member 1.

A thickness T1 of the first thermal-conductive layer 41P is not limited. The thickness T1 may be 100 μm or less, and may be 80 μm or less. In this case, the height can be reduced, and the heat conduction in the thickness direction tends to be facilitated. On the other hand, in view of securing the electrical insulation and maintaining the internal space S, the thickness T1 may be 1 dun or more, and may be 10 μm or more. The thickness T1 of the first thermal-conductive layer 41P is a distance between the principal surfaces of the first thermal-conductive layer 41P. The distance between the principal surfaces can be determined by averaging the distances at 10 randomly selected points. A thickness T2 of the second thermal-conductive layer 42P can be determined in a similar manner to the above.

In view of electrical insulation, the volumetric resistivity of the first thermal-conductive layer 41P may be $1\times10^8$ Ω·cm or more, and may be $1\times10^{10}$ Ω·cm or more.

The first resin composition includes a thermosetting resin. The first resin composition includes, for example, a thermosetting resin, a curing agent, a thermoplastic resin, an inorganic filler, and a first thermal-conductive filler.

Examples of the thermosetting resin include, but not limited to, epoxy resin, (meth)acrylic resin, phenol resin, melamine resin, silicone resin, urea resin, urethane resin, vinyl ester resin, unsaturated polyester resin, diallyl phthalate resin, and polyimide resin. These may be used singly or in combination of two or more kinds thereof. Preferred is an epoxy resin.

The thermosetting resin before sealing may be in an uncured state or in a semi-cured state. The semi-cured state means a state in which the thermosetting resin includes a monomer and/or an oligomer, and the development of three-dimensional cross-linked structure of the thermosetting resin is insufficient. The semi-cured thermosetting resin is in a so-called B stage, i.e., a state in which the resin does not dissolve in a solvent at room temperature (25° C.) but is not cured completely.

Examples of the epoxy resin include, but not limited to, bisphenol A-type epoxy resin, bisphenol F-type epoxy resin, bisphenol AD-type epoxy resin, hydrogenated bisphenol A-type epoxy resin, hydrogenated bisphenol F-type epoxy resin, phenol novolac-type epoxy resin, naphthalene-type epoxy resin, alicyclic aliphatic epoxy resin, and glycidyl ethers of organic carboxylic acids. These may be used singly or in combination of two or more kinds thereof. The epoxy resin may be a prepolymer, and may be a copolymer of an epoxy resin, such as polyether-modified epoxy resin or silicone-modified epoxy resin, and another polymer. Preferred are a bisphenol AD-type epoxy resin, a naphthalene type epoxy resin, a bisphenol A-type epoxy resin, and/or a bisphenol F-type epoxy resin. Particularly preferred are a bisphenol A-type epoxy resin and a bisphenol F-type epoxy resin because of their excellent heat resistance and water resistance and their inexpensive prices.

For viscosity adjustment of the resin composition, the epoxy resin can include a monofunctional epoxy resin having one epoxy group in its molecule, in an amount of approximately 0.1 mass % or more and 30 mass % or less in the whole epoxy resin. Examples of the monofunctional epoxy resin include phenylglycidyl ether, 2-ethylhexyl glycidyl ether, ethyldiethylene glycol glycidyl ether, dicyclopentadiene glycidyl ether, and 2-hydroxyethyl glycidyl ether. These may be used singly or in combination of two or more kinds thereof.

The resin composition includes a curing agent for the thermosetting resin. Examples of the curing agent include, but not limited to, a phenolic curing agent (e.g., phenol resin), a dicyandiamide-based curing agent (e.g., dicyandiamide), a urea-based curing agent, an organic acid hydrazide-based curing agent, a polyamine salt-based curing agent, an amine adduct-based curing agent, an acid anhydride-based curing agent, and an imidazole-based curing agent. These may be used singly or in combination of two or more kinds thereof. The kind of the curing agent may be selected as appropriate according to the thermosetting resin. Preferred is a phenol-based curing agent because of its low outgassing during curing, moisture resistance, and heat cycle resistance.

The amount of the curing agent differs depending on the kind of the curing agent. When an epoxy resin is used, for example, the curing agent can be used in an amount such that the functional group equivalent of the curing agent is 0.001 eq or more and 2 eq or less, and further 0.005 eq or more and 1.5 eq or less, per one equivalent of the epoxy group.

The dicyandiamide-based curing agent, the urea-based curing agent, the organic acid hydrazide-based curing agent, the polyamine salt-based curing agent, and the amine adduct-based curing agent are latent curing agents. The activation temperature of the latent curing agent may be 60° C. or higher, and further 80° C. or higher. The activation temperature may be 250° C. or lower, and further 180° C. or lower. This can provide a resin composition that can cure quickly at a temperature equal to or higher than the activation temperature.

The thermoplastic resin can be blended as a sheeting agent. The resin composition, by being formed into a sheet, exhibits improved handleability in the sealing process and is unlikely to cause dripping or other inconveniences. This serves to maintain the internal space S.

The thermoplastic resin may be of the following kind: for example, acrylic resin, phenoxy resin, polyolefin, polyurethane, block isocyanate, polyether, polyester, polyimide, polyvinyl alcohol, butyral resin, polyamide, vinyl chloride, cellulose, thermoplastic epoxy resin, and thermoplastic phenol resin. Preferred is an acrylic resin because it functions well as a sheet-forming agent. The amount of the thermoplastic resin may be 5 parts by mass or more and 200 parts by mass or less, and may be 10 parts by mass or more and 150 parts by mass or less, per 100 parts by mass of the thermosetting resin.

The thermoplastic resin may be added in any form to the resin composition. For example, the thermoplastic resin may be particles having a weight average particle diameter of 0.01 Nm or more and 200 μm or less, and may be particles having a weight average particle diameter of 0.01 μm or more and 100 μm or less. The particles may have a core-shell structure. In this case, the core may be, for example, a polymer containing a unit derived from at least one monomer selected from the group consisting of n-, i-, and t-butyl (meth)acrylates, and may be a polymer containing a unit derived from a (meth)acrylate other than the above. The shell layer may be, for example, a copolymer of a monofunctional monomer, such as methyl(meth)acrylate, n-, i-, or t-butyl(meth)acrylate, or (meth)acrylic acid, and a polyfunctional monomer, such as 1,6-hexanediol diacrylate. Also, for example, a high-purity thermoplastic resin dispersed or dissolved in a solvent may be added to the resin compound.

Examples of the inorganic filler that may be contained in the resin composition include silica such as fused silica, talc, calcium carbonate, titanium white, red iron oxide, silicon carbide, and boron nitride (BN). Preferred is a fused silica because of its inexpensive price. The average particle size of the inorganic filler is, for example, 0.01 μm or more and 100 μm or less. The amount of the inorganic filler may be 1 part by mass or more and 5000 parts by mass or less, and may be 10 parts by mass or more and 3000 parts by mass or less, per 100 parts by mass of the thermosetting resin. The average particle size means a particle diameter at 50% cumulative volume in a volumetric particle size distribution (D50; this applies hereinafter).

The first thermal-conductive filler is not limited as long as it has thermal conductivity, and may have isotropic thermal conductivity or anisotropic thermal conductivity. Examples of the first thermal-conductive filler include crystalline silica, BN, silicon nitride, aluminum nitride (AlN), aluminum oxide ($Al_2O_3$), magnesium oxide, zinc oxide, and diamond. These may be used singly or in combination of two or more kinds thereof. Preferred are BN, $Al_2O_3$, and AlN because they are excellent in thermal conductivity, and BN and $Al_2O_3$ are further preferred because they are excellent in moisture resistance. Also, for example, AlN with surface-treated with $Al_2O_3$ or an electrically insulating organic compound may be used.

The first thermal-conductive filler may be of any shape, and is, for example, particulate, fibrous, or flaky in shape. Preferred is a particulate shape. In this case, the coefficient of thermal conductivity in the thickness direction is likely to be equal to or greater than that in the principal surface direction. The fibrous or flaky first thermal-conductive filler tends to orient in the principal surface direction during sealing. The particulate first thermal-conductive filler may be secondary particles, and may be obtained by granulating a fibrous or flaky filler. Examples of the particulate thermally conductive filler include flaky BN filler aggregated into secondary particles, $Al_2O_3$ particles, and AlN particles. The average particle diameter of the particulate first thermal-conductive filler is not limited, but may be, for example, 0.01 μm or more and 100 μm or less.

The fibrous or flaky shape refers to a shape having an aspect ratio of, for example, 2 or more and 50 or less, preferably 5 or more and 50 or less. The particulate shape refers to a shape having an aspect ratio of, for example, 1 or more and less than 2.

The amount of the first thermal-conductive filler is not limited, but may be set as appropriate, with taking into account the kind of the first thermal-conductive filler, or the tan δ1 of the first thermal-conductive layer 41P. For example, the amounts of BN, $Al_2O_3$ and AlN may be each 1 part by mass or more and 5000 parts by mass or less, per 100 parts by mass of the thermosetting resin. As for a substance like BN blended to serve as both an inorganic filler and a thermally conductive filler, regarded as being blended as an inorganic filler and a thermally conductive filler, the amount is calculated for each purpose.

The first resin composition may contain a third component other than the above. Examples of the third component include a curing accelerator, a polymerization initiator, a flame retardant, a pigment, a silane coupling agent, and a thixotropic agent.

Examples of the curing accelerator include, but not limited to, a modified imidazole-based curing accelerator, a modified aliphatic polyamine-based accelerator, and a modified polyamine-based accelerator. The curing accelerator is preferably used in the form of a reaction product (adduct) with a resin such as an epoxy resin. These may be used singly or in combination of two or more kinds thereof. In view of storage stability, the activation temperature of the curing accelerator may be 60° C. or higher, and further 80° C. or higher. The activation temperature may be 250° C. or lower, and further 180° C. or lower. The activation temperature herein refers to a temperature at which the curing of the thermosetting resin is accelerated by the action of the latent curing agent and/or the curing accelerator.

The amount of the curing accelerator differs depending on the kind of the curing accelerator. Usually, the amount may be 0.1 part by mass or more and 20 parts by mass or less, and may be 1 part by mass or more and 10 parts by mass or less, per 100 parts by mass of the epoxy resin. When the curing accelerator is used in the form of an adduct, the amount of the curing accelerator means the net amount of the curing accelerator excluding the component (e.g., epoxy resin) other than the curing accelerator.

The polymerization initiator exhibits curability by irradiation with light and/or application of heat. The polymerization initiator may be, for example, a radical generator, an acid generator, or a base generator. Specific examples thereof include a benzophenone-based compound, a hydroxy ketone-based compound, an azo compound, an organic peroxide, and a sulfonium salt, such as aromatic sulfonium salt or aliphatic sulfonium salt. The amount of the polymerization initiator may be, for example, 0.1 part by mass or more and 20 parts by mass or less, and may be 1 part by mass or more and 10 parts by mass or less, per 100 parts by mass of the epoxy resin.

(Second Thermal-Conductive Layer)

The second cured thermal-conductive layer 42 serves to diffuse the heat transmitted from the second circuit members 2 to the first cured thermal-conductive layer 41, throughout the mounting structure (or the mounting chip), and then transmit the heat to the first circuit member 1. The coefficient of thermal conductivity $\lambda 2_S$ in the principal surface direction at room temperature of the second cured thermal-conductive layer 42 is greater than the coefficient of thermal conductivity $\lambda 2_T$ in the thickness direction. The mounting structure (or the mounting chip) may be provided with a heat dissipation means other than the first circuit member 1. In this case, the heat transmitted to the first cured thermal-conductive layer 41 is more likely allowed to dissipate by the heat dissipation means.

A ratio: $\lambda 2_T/\lambda 2_S$ of the coefficient of thermal conductivity $\lambda 2_T$ to the coefficient of thermal conductivity $\lambda 2_S$ may be any value less than 1. The ratio: $\lambda 2_T/\lambda 2_S$ may be less than 0.8, and may be less than 0.5. In this case, the heat of the second circuit members 2 tends to diffuse throughout the mounting structure (or the mounting chip), and tends to conduct to the first circuit member 1.

The coefficient of thermal conductivity $\lambda 2_S$ is not limited, but may be 1 W/m·K or more, and may be 3 W/m·K or more. A ratio: $\lambda 1_T/\lambda 2_S$ of the coefficient of thermal conductivity $\lambda 1_T$ in the thickness direction at room temperature of the first cured thermal-conductive layer 41 to the coefficient of thermal conductivity $\lambda 2_S$ in the principal surface direction at room temperature of the second cured thermal-conductive layer 42 is not limited. In view of enhancing the heat dissipation effect, the ratio: $\lambda 1_T/\lambda 2_S$ is preferably 2 or less.

The second thermal-conductive layer is formed of a second resin composition containing a thermosetting resin.

The loss tangent tan δ2 of the second resin composition at the temperature t may be greater than 0.3. In this case, when the second circuit members 2 are sealed, the second thermal-conductive layer 42P becomes likely to flow, tending to increase the coefficient of thermal conductivity in the principal surface direction, as well as to form a smooth sealing surface of the mounting structure 10. The upper limit of the loss tangent tan δ2 is not limited, but, for example, may be 10, and may be 8. The second thermal-conductive layer 42P alone, however, is difficult to complete sealing so as to maintain the internal space S.

A storage shear modulus G2' of the second resin composition at the temperature t may by $1.0 \times 10^3$ Pa or more. The upper limit of the storage shear modulus G2' is not limited, but, for example, may be $1.0 \times 10^7$ Pa, and may be $1.0 \times 10^6$ Pa. When the storage shear modulus G2' at the temperature t is within the range as above, the second thermal-conductive layer 42P becomes likely to flow, and the sealed surface tend to be smooth.

The second resin composition is formed of a thermosetting resin and a second thermal-conductive filler. The constitution of the second resin composition is not limited, but may be similar to that of the first resin composition.

The second thermal-conductive filler is not limited as long as it has anisotropic thermal conductivity, and may be, for example, a material similar to the first thermal-conductive filler. The second thermal-conductive filler may be formed of a filler with anisotropic thermal conductivity alone, and may be formed of a filler with anisotropic thermal conductivity and a filler with isotropic thermal conductivity in combination. The second thermal-conductive filler may be blended in a similar amount to that of the first thermal-conductive filler.

The second thermal-conductive filler may be of any shape. To increase the coefficient of thermal conductivity in the principal surface direction, the second thermal-conductive filler preferably include a fibrous or flaky filler. Examples of such a filler include flakey BN. When 30 mass % or more of the second thermal-conductive filler is fibrous or flaky, the coefficient of thermal conductivity in the principal surface direction can be further increased. The average particle size of the second thermal-conductive filler is also not limited, but may be, for example, 0.01 μm or more and 100 μm or less.

In view of further enhancing the heat dissipation performance, it is preferable that the first thermal-conductive layer 41P contains at least one selected from the group consisting of flaky BN filler aggregated into secondary particles, $Al_2O_3$ particles, and AlN particles, as the first thermal-conductive filler, while the second thermal-conductive layer 42P contains flaky BN filler, as the second thermal-conductive filler. It is particularly preferable that flaky BN filler aggregated into secondary particles and $Al_2O_3$ particles are both contained as the first thermal-conductive filler.

The viscoelasticity (i.e., loss tangent tan δ) can be adjusted, for example, by the composition of the first resin composition and/or the second resin composition. For example, changing the amount or the kind of the thermoplastic resin serving as the sheeting agent can change the loss tangent tan δ. Specifically, using a phenoxy resin can easily lower the storage shear modulus G2' and increase the tan δ. The amount of the thermoplastic resin contained in the second resin composition may be 5 parts by mass or more and 200 parts by mass or less, and may by 10 parts by mass or more and 150 parts by mass or less, per 100 parts by mass of the thermosetting resin.

A thickness T2 of the second thermal-conductive layer 42P may be 10 μm or more and 1400 μm or less. In this case, in the sealing step, the internal space S tends to be maintained, and the sealed surface of the mounting structure 10 tends to be smooth. The volumetric resistivity of the second thermal-conductive layer 42P is not limited, but may be almost equal to or smaller than that of the first thermal-conductive layer 41P. The thickness T2 may be 10 μm or more and 740 μm or less.

An overall thickness T of the laminate sheet 4P is not limited. In view of bringing it into close contact with the surfaces of the second circuit members 2, the thickness T may be 11 μm or more and 1500 μm or less, may be 20 μm or more and 1000 μm or less, and may be 20 μm or more and 750 μm or less.

The laminate sheet 4P may further include a third layer. Note that the first thermal-conductive layer 41P is disposed on one outermost side, and the second thermal-conductive layer 42P is disposed adjacent to the first thermal-conductive layer 41P. In other words, the third layer is disposed as the outermost layer on the other side. The third layer may be a single layer or a laminate of a plurality of layers.

[Manufacturing Method of Mounting Structure]

A manufacturing method according to the present embodiment will be described below with reference to FIG. 4(a)-4(d). FIG. 4(a)-4(d) is a set of schematic diagrams for explaining a manufacturing method according to the present embodiment by way of cross sections of a mounting member or a mounting structure 10.

The mounting structure 10 is manufactured by a method including: a first preparation step of preparing a mounting member including a first circuit member 1 and a plurality of second circuit members 2 placed on the first circuit member 1, the mounting member having an internal space S between the first circuit member 1 and the second circuit member 2; a second preparation step of preparing a laminate sheet 4P; a disposing step of disposing the laminate sheet 4P on the mounting member such that a first thermal-conductive layer 41P faces the second circuit members 2; and a sealing step of pressing the laminate sheet 4P against the first circuit member 1 and heating the laminate sheet 4P, to seal the second circuit members 2 so as to maintain the internal space S, and to cure the laminate sheet 4P. The method may further include an individualization step of dicing the obtained mounting structure 10 into individual second circuit members 2.

(First Preparation Step)

Figure 4A:
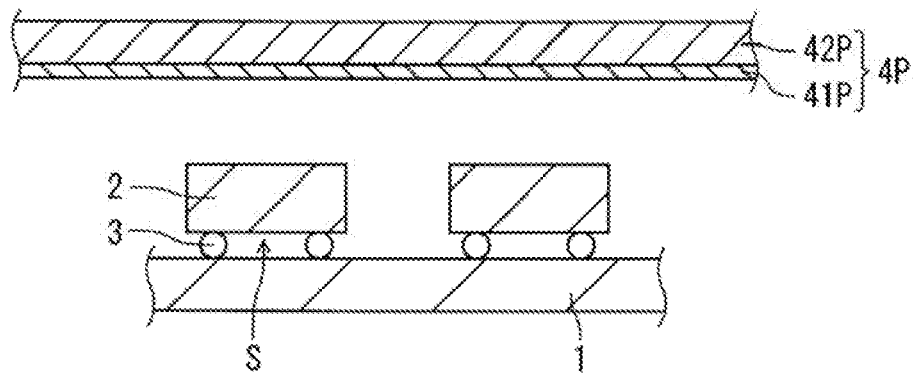

Amounting member including a first circuit member 1 and a plurality of second circuit members 2 placed on the first circuit member 1 is prepared (FIG. 4(a)). The second circuit member 2 is placed on the first circuit member 1, for example, with bumps 3 interposed therebetween. Therefore, an internal space S is formed between the first circuit member 1 and the second circuit member 2.

The first circuit member 1 is, for example, at least one selected from the group consisting of a semiconductor element, a semiconductor package, a glass substrate, a resin substrate, a ceramic substrate, and a silicon substrate. The first circuit member 1 may have at its surface an electrically conductive material layer, such as ACF (anisotropic conductive film) or ACP (anisotropic conductive paste). The resin substrate may be a rigid resin substrate or a flexible resin substrate, examples of which include an epoxy resin substrate (e.g., glass epoxy substrate), a bismaleimide triazine substrate, a polyimide resin substrate, and a fluororesin substrate. The first circuit member 1 may be a component built-in substrate in which a semiconductor chip and the like are incorporated.

The second circuit member 2 is placed on the first circuit member 1, for example, with the bumps 3 interposed therebetween. This forms the internal space S between the first circuit member 1 and the second circuit member 2. The second circuit member 2 is an electronic component that requires to be sealed (hollow-sealed) with the internal space S maintained. Examples of the second circuit member 2 include RFIC, SAW, sensor chip (e.g., acceleration sensor), piezoelectric oscillator chip, quartz oscillator chip, and MEMS device.

The bumps 3 have electrical conductivity, and the first circuit member 1 and the second circuit member 2 are electrically connected to each other via the bumps 3. The height of the bumps 3 is not limited, but may be, for example, 5 μm or more and 150 μm or less. The material of the bumps 3 is also not limited as long as it has electrical conductivity. Examples of the material include copper, gold, and solder balls.

In short, the mounting member may have various structures in which the second circuit members 2 are placed on various kinds of the first circuit member 1, such as a chip-on-board (CoB) structure (including chip-on-wafer (CoW), chip-on-film (CoF), and chip-on-glass (CoG)), a chip-on-chip (CoC) structure, a chip-on-package (CoP) structure, and a package-on-package (PoP) structure. The mounting member may be a multi-layered mounting member in which, for example, on the first circuit member 1 with the second circuit members 2 placed thereon, the first member and/or the second circuit members 2 are further placed.

The mounting member may further include a third circuit member (not shown) having a possibility of generating heat, the third circuit member placed on the first circuit member. Even when the third circuit member that generates heat is placed, since the laminate sheet 4P facilitates heat dissipation, thermal impact on the second circuit members 2 can be suppressed. Examples of the third circuit member include a power amplifier.

(Second Preparation Step)

A laminate sheet 4P including a first thermal-conductive layer 41P and a second thermal-conductive layer 42P is prepared (FIG. 4(a)).

The method of producing the laminate sheet 4P is not limited. The laminate sheet 4P may be formed by separately forming each layer and laminating the layers together (laminating method), or by sequentially applying a material of each layer (coating method).

In the laminating method, each layer is formed by a process including, for example, a step of preparing a solvent paste or solvent-free paste containing the above resin composition (hereinafter, simply collectively referred to as paste), and a step (foming step) of forming each layer from the paste. The first thermal-conductive layer 41P and the second thermal-conductive layer 42P are each formed through the above process, and then laminated in this order. When the paste contains a pre-gelling agent, gelation is carried out during the forming step. The gelation is carried out after a paste is formed into a thin film, by heating the thin film at a temperature lower than the curing temperature of the thermosetting resin (e.g., at 70° C. or higher and 150° C. or lower) for 1 min or more and 10 min or less.

On the other hand, in the coating method, for example, the first thermal-conductive layer 41P is formed through the above process, which is followed by applying a paste containing the second resin composition onto a surface of the first thermal-conductive layer 41P, to form the second thermal-conductive layer 42P. In this case also, gelation can be carried out during the Raining step. The gelation may be carried out one after another for each paste formed into a thin film, and may be carried out after the thin films are formed into a laminate.

Each layer (thin film) may be formed using, for example, a die, a roll coater, or a doctor blade. In this case, the paste is preferably adjusted to have a viscosity of 10 mPa·s or more and 10,000 mPa·s or less. When a solvent paste is used, the film may be dried at a temperature of 70° C. or higher and 150° C. or lower for 1 min or more and 10 min or less, thereby to remove the solvent. The gelation and the removal of the solvent can be carried out simultaneously.

(Disposing Step)

The laminate sheet 4P is disposed onto the mounting member such that the first thermal-conductive layer 41P faces the second circuit members 2. When the third circuit member is placed, the first thermal-conductive layer 41P is faced to the third circuit member as well as to the second circuit members.

In this case, the plurality of the second circuit members 2 and further the third circuit member may be covered with one sheet of the laminate sheet 4P. This can collectively seal the surfaces of the plurality of the second circuit members 2 and the surfaces between the second circuit members 2 of the first circuit member 1.

(Sealing Step)

Figure 4B:
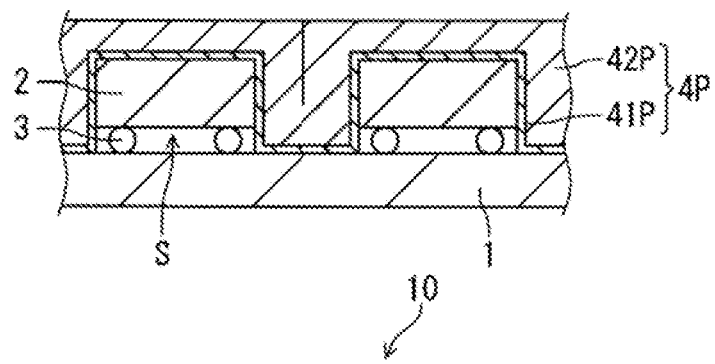
Figure 4C:
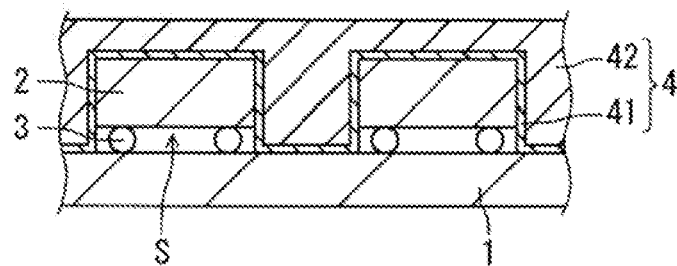

The laminate sheet 4P is pressed against the first circuit member 1 (FIG. 4(b)), and the laminate sheet 4P is heated. This can seal the second circuit members 2, and further the third circuit member, so as to maintain the internal space S. The laminate sheet 4P is cured simultaneously with sealing of the second circuit members 2 and others, or after the second circuit members 2 and others are sealed (FIG. 4(c)).

The pressing of the laminate sheet 4P against the first circuit member 1 is performed, for example, while heating the laminate sheet 4P at a temperature lower than the curing temperature of the thermosetting resin contained in the laminate sheet 4P (hot pressing). In this way, the second circuit members 2 are sealed. At this time, the laminate sheet 4P comes in close contact with the surfaces of the second circuit members 2, and tends to extend until it reaches the surfaces between the second circuit members 2 of the first circuit member 1. This improves the reliability of sealing of the second circuit members 2.

The hot pressing may be performed under atmospheric pressure, and may be performed under a reduced pressure atmosphere (e.g., 50 Pa or more and 50,000 Pa or less, preferably 50 Pa or more and 3,000 Pa or less). The heating conditions during pressing are not limited, but may be set as appropriate according to the pressing method and the kind of the thermosetting resin. The heating is performed, for example, at 40° C. or higher and 200° C. or lower (preferably 50° C. or higher and 180° C. or lower) for 1 sec or more and 300 min or less (preferably 3 sec or more and 300 min or less).

Subsequently, the laminate sheet 4P is heated at the above curing temperature to cure the thermosetting resin in the laminate sheet 4P, to form the sealing material 4. The conditions for heating the laminate sheet 4P (curing the thermosetting resin) may be set as appropriate according to the kind of the thermosetting resin. The curing of the thermosetting resin is performed, for example, at 50° C. or higher and 200° C. or lower (preferably 120° C. or higher and 180° C. or lower) for 1 sec or more and 300 min or less (preferably, 60 min or more and 300 min or less).

The hot pressing and the curing of the thermosetting resin may be performed separately or simultaneously. For example, after the hot pressing is performed at a temperature lower than the curing temperature of the thermosetting resin contained in the laminate sheet 4P under a reduced pressure atmosphere, the reduced pressure is released, and heating may be performed at a higher temperature under atmospheric pressure, to cure the thermosetting resin. Alternatively, after the hot pressing is performed at a temperature lower than the curing temperature of the thermosetting resin contained in the laminate sheet 4P under atmospheric pressure, heating may be performed at a higher temperature, to cure the thermosetting resin. Alternatively, the hot pressing may be performed at the curing temperature under a reduced pressure atmosphere, so that the thermosetting resin is cured during pressure reduction.

In the manner as above, the mounting structure 10 can be obtained, the mounting structure including: a mounting member including the first circuit member 1, and the plurality of the second circuit members 2 placed on the first circuit member 1, and a sealing material sealing the mounting member.

(Individualization Step)

Figure 4D:
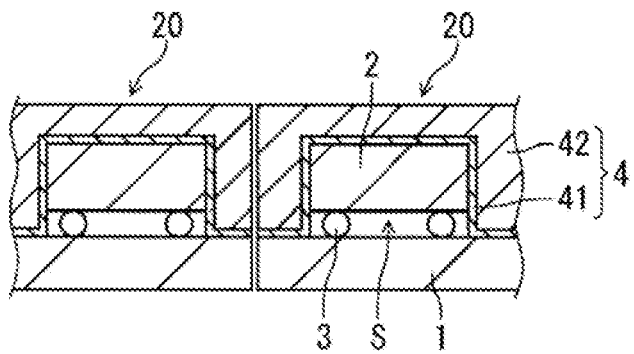

An individualization step of dicing the obtained mounting structure 10 into individual second circuit members 2 may be performed (FIG. 4(d)). This provides a chip-level mounting structure (mounting chip 20).

INDUSTRIAL APPLICABILITY

The manufacturing method of a mounting structure of the present invention can achieve hollow sealing and excellent heat dissipation performance and, therefore, is useful as a manufacturing method of various mounting structures. Moreover, the laminate sheet of the present invention used in this method is also suitably applicable for manufacturing various mounting structures.

REFERENCE SIGNS LIST

10: mounting structure
1: first circuit member
2: second circuit member
3: bump
4: sealing material (cured product of laminate sheet)
    41: first cured thermal-conductive layer
    42: second cured thermal-conductive layer
4P: laminate sheet
    41P: first thermal-conductive layer
    42P: second thermal-conductive layer
20: mounting chip

The invention claimed is:

1. A manufacturing method of a mounting structure, the method comprising:
   a step of preparing a mounting member including a first circuit member and a plurality of second circuit members placed on the first circuit member, the mounting member having a space between the first circuit member and the second circuit member;
   a step of preparing a laminate sheet including a first thermal-conductive layer and a second thermal-conductive layer, the first thermal-conductive layer disposed at least on one outermost side;
   a disposing step of disposing the laminate sheet on the mounting member such that the first thermal-conductive layer faces the second circuit members; and
   a sealing step of pressing the laminate sheet against the first circuit member and heating the laminate sheet, to seal the second circuit members so as to maintain the space while suppressing intrusion of the laminate sheet, and to cure the laminate sheet, wherein
   the first thermal-conductive layer after curing has a coefficient of thermal conductivity in a thickness direction at room temperature being equal to or greater than a coefficient of thermal conductivity in a principal surface direction, and
   the second thermal-conductive layer after curing has a coefficient of thermal conductivity in a principal surface direction at room temperature being greater than a coefficient of thermal conductivity in a thickness direction.

2. The manufacturing method of claim 1, wherein the coefficient of thermal conductivity in the thickness direction at room temperature of the first thermal-conductive layer after curing is 1 W/mK or more.

3. The manufacturing method of claim 1, wherein the coefficient of thermal conductivity in the principle surface direction at room temperature of the second thermal-conductive layer after curing is 1 W/mK or more.

4. The manufacturing method of claim 1, wherein
   the first thermal-conductive layer is formed of a first resin composition containing a thermosetting resin, and
   the first resin composition has a loss tangent tan $\delta_1$ of 1 or less, at a temperature t when the second circuit members are sealed.

5. The manufacturing method of claim 1, wherein
   the second thermal-conductive layer is formed of a second resin composition containing a thermosetting resin, and
   the second resin composition has a loss tangent tan $\delta_2$ of greater than 0.3, at the temperature t when the second circuit members are sealed.

6. The manufacturing method of claim 1, wherein
   the mounting member further includes a third circuit member being different from the second circuit members and having a possibility of generating heat, the third circuit member placed on the first circuit member,
   in the disposing step, the first thermal-conductive layer is disposed so as to face the second circuit members and the third circuit member, and
   in the sealing step, the second circuit members and the third circuit member are sealed.

7. A laminate sheet for sealing a mounting member including a first circuit member and a plurality of second circuit members placed on the first circuit member, the mounting member having a space between the first circuit member and the second circuit member, the laminate sheet comprising:
   a first thermal-conductive layer and a second thermal-conductive layer,
   the first thermal-conductive layer disposed at least on one outermost side, wherein
   the first thermal-conductive layer after curing has a coefficient of thermal conductivity in a thickness direction at room temperature being equal to or greater than a coefficient of thermal conductivity in a principal surface direction, and
   the second thermal-conductive layer after curing has a coefficient of thermal conductivity in a principal surface direction at room temperature being greater than a coefficient of thermal conductivity in a thickness direction.

8. The laminate sheet of claim 7, wherein the coefficient of thermal conductivity in the thickness direction at room temperature of the first thermal-conductive layer after curing is 1 W/m·K or more.

9. The laminate sheet of claim 7, wherein the coefficient of thermal conductivity in the principle surface direction at room temperature of the second thermal-conductive layer after curing is 1 W/m·K or more.

10. The laminate sheet of claim 7, wherein
    the first thermal-conductive layer is formed of a first resin composition containing a thermosetting resin, and
    the first resin composition has a loss tangent tan $\delta_1$ of 1 or less, at a temperature t when the second circuit members are sealed.

11. The laminate sheet of claim 7, wherein
    the second thermal-conductive layer is formed of a second resin composition containing a thermosetting resin, and
    the second resin composition has a loss tangent tan $\delta_2$ of greater than 0.3, at the temperature t when the second circuit members are sealed.

* * * * *